United States Patent
Tanaka et al.

(10) Patent No.: US 7,325,225 B2
(45) Date of Patent: Jan. 29, 2008

(54) METHOD AND APPARATUS FOR REDUCING OPC MODEL ERRORS

(76) Inventors: Yasushi Tanaka, 1 Dunhill Dr., Somers, NY (US) 10589; Masahiro Inohara, 21-5 Woods Brooke Ct., Ossining, NY (US) 10506; Matthew Angyal, 33 Honeysuckle Ct., Stormville, NY (US) 12582

(*) Notice: Subject to any disclaimer, the term of this patent is extended or adjusted under 35 U.S.C. 154(b) by 0 days.

(21) Appl. No.: 11/243,933

(22) Filed: Oct. 5, 2005

(65) Prior Publication Data
US 2007/0079278 A1 Apr. 5, 2007

(51) Int. Cl.
*G06F 17/50* (2006.01)
(52) U.S. Cl. .............. 716/21; 716/19; 716/20; 430/5; 430/30
(58) Field of Classification Search ........... 716/19–21; 703/2; 430/5, 30
See application file for complete search history.

(56) References Cited

U.S. PATENT DOCUMENTS

| | | | |
|---|---|---|---|
| 6,510,730 B1* | 1/2003 | Phan et al. ............... 73/105 |
| 6,544,699 B1* | 4/2003 | Kim et al. ................ 430/30 |
| 6,567,972 B1* | 5/2003 | Tanaka et al. ............ 716/21 |
| 6,993,742 B2* | 1/2006 | Fryer et al. .............. 716/19 |
| 7,003,758 B2* | 2/2006 | Ye et al. .................. 716/21 |
| 7,065,738 B1* | 6/2006 | Kim ........................ 716/19 |
| 7,080,349 B1* | 7/2006 | Babcock et al. .......... 716/19 |
| 7,090,949 B2* | 8/2006 | Nojima et al. ........... 430/5 |
| 7,111,277 B2* | 9/2006 | Ye et al. .................. 716/21 |
| 7,149,999 B2* | 12/2006 | Kahng et al. ............ 716/19 |
| 2003/0177467 A1 | 9/2003 | Ohnuma et al. ......... 716/19 |
| 2003/0192015 A1 | 10/2003 | Liu .......................... 716/4 |
| 2004/0005089 A1 | 1/2004 | Robles et al. ............ 382/141 |
| 2004/0019872 A1 | 1/2004 | Lippincott et al. ....... 716/21 |

(Continued)

OTHER PUBLICATIONS

Schellenberg et al., A new process monitor for recticles and wafers: The MEEF meter, 2000, SPIE's, vol. 3998, pp. 187-194.*

(Continued)

*Primary Examiner*—Jack Chiang
*Assistant Examiner*—Nghia M. Doan
(74) *Attorney, Agent, or Firm*—Mayer & Williams PC; Karin L. Williams, Esq.

(57) ABSTRACT

It is important to assess and reduce errors that arise in mask correction techniques such as optical proximity correction. A preliminary mask is obtained using an OPC model. An etched wafer is created from the preliminary mask using lithography, and first and second critical dimensions (CD) are measured on the wafer and. An edge placement error (EPE) is determined that corresponds to a difference between a measured value and a desired value of the second CD. These steps are repeated for a plurality of different values of the first CD, and of for each of the values of, the measured value of the second CD is correlated with its corresponding value on the mask as predicted by the OPC model. A difference ΔCD is obtained between the difference of the mask CDs calculated by interpolation of wafer CD measurements and by OPC model predictions and is transformed into an OPC model error.

5 Claims, 5 Drawing Sheets

U.S. PATENT DOCUMENTS

| | | | |
|---|---|---|---|
| 2004/0063000 A1 | 4/2004 | Maurer et al. | 430/5 |
| 2004/0088149 A1 | 5/2004 | Cobb | 703/13 |
| 2004/0133871 A1 | 7/2004 | Granik et al. | 716/19 |
| 2004/0225488 A1 | 11/2004 | Wang et al. | 703/22 |
| 2004/0237061 A1 | 11/2004 | Kahng et al. | 716/19 |
| 2005/0044513 A1 | 2/2005 | Robles et al. | 716/4 |
| 2005/0097501 A1 | 5/2005 | Cobb et al. | 716/21 |
| 2005/0100802 A1* | 5/2005 | Callan et al. | 430/5 |
| 2005/0112474 A1 | 5/2005 | Sandstrom | 430/5 |

OTHER PUBLICATIONS

Schellenberg, Frank M., "Resolution Enhancement with OPC/PSM", Future Fab Intl., vol. 9, Jan. 7, 2000, http://www.future-fab.com/documents.asp?d_ID=1202, 18 pages.

Cobb, Nicolas Bailey, "Fast Optical and Process Proximity Correction Algorithms For Integrated Circuit Manufacturing," Dissertation submitted Spring 1998, 32 pages.

* cited by examiner

| 2D Pitch (nm) | EPE calculated by OPC model (nm/edge) | Model fitting error (nm/edge) | Residual Error (nm/edge) | | Residual Error (nm/shape) |
|---|---|---|---|---|---|
| 220 | 2.0 | 0.6 | 2.63 | Conversion → | 5.3 |
| 230 | 0.5 | -0.2 | 0.26 | | 0.5 |
| 240 | 0.6 | -1.3 | -0.66 | | -1.3 |
| 250 | 2.1 | 0.5 | 2.63 | | 5.3 |
| 260 | 1.0 | 1.7 | 2.66 | | 5.3 |
| 280 | -0.9 | 2.9 | 2.04 | | 4.1 |
| 300 | 1.8 | 1.7 | 3.49 | | 7.0 |
| 320 | 0.8 | 0.6 | 1.43 | | 2.9 |
| 400 | 1.4 | 0.1 | 1.49 | | 2.0 |
| 500 | 1.3 | 0.7 | 1.96 | | 3.9 |
| 600 | 1.2 | -0.8 | 0.37 | | 0.7 |
| 800 | 3.0 | -3.0 | 0.01 | | 0.0 |
| 1000 | 3.3 | -2.4 | 0.86 | | 1.7 |

| Space (nm) | EPE calculated by OPC model (nm/edge) | Model fitting error (nm/edge) | Residual error (nm/edge) |
|---|---|---|---|
| 163 | -1.2 | 5.0 | 3.8 |
| 181 | 0.5 | 4.5 | 5.0 |
| 200 | -0.3 | 4.8 | 4.5 |
| 238 | 2.4 | 5.3 | 7.7 |
| 281 | 0.7 | 4.2 | 4.9 |
| 338 | -0.4 | 5.8 | 5.4 |

FIG. 10

| Linewidth (nm) | EPE calculated by OPC model (nm/edge) | Model fitting error (nm/edge) | Residual error (nm/edge) |
|---|---|---|---|
| 181 | 2.4 | -2.2 | 0.2 |
| 200 | -0.3 | 4.8 | 4.5 |
| 238 | -2.5 | 1.9 | -0.6 |
| 281 | -0.8 | 4.0 | 3.2 |
| 338 | 1.4 | -1.5 | -0.1 |
| 400 | -3.3 | -2.5 | -5.8 |

METHOD AND APPARATUS FOR REDUCING OPC MODEL ERRORS

FIELD OF THE INVENTION

The present invention relates generally to mask correction techniques employed in photolithography processes, and more particularly to a method for assessing and reducing errors that arise in mask correction techniques such as optical proximity correction.

BACKGROUND OF THE INVENTION

Semiconductor devices or integrated circuits (ICs) can include millions of devices such as transistors. For instance, ultra-large scale integrated (ULSI) circuits can include complementary metal oxide semiconductor (CMOS) field effect transistors (FET). Despite the ability of conventional systems and processes to fabricate millions of devices on an IC, because of technical and market pressures, there is still a need to decrease the size of IC device features, and, thus, increase the number of devices on an IC.

One limitation to achieving further reductions in the size of the critical dimensions of IC devices is conventional photolithography. In photolithography, a design is transferred onto a surface or wafer by shining a light through a mask (or reticle) of the design onto a photosensitive material covering the surface. The light exposes the photo-sensitive material in the pattern of the mask. A chemical process etches away either the exposed material or the unexposed material, depending on the particular process that is being used. Another chemical process etches into the wafer wherever the photosensitive material was removed. The result is the design itself, either imprinted into the wafer where the surface has been etched away, or protruding slightly from the wafer as a result of the surrounding material having been etched away.

As the size of the devices to be created become similar in size or smaller than the wavelength of light used to illuminate the wafer, distortions occur whereby the pattern of objects formed on the wafer do not correspond to the pattern of objects defined by the mask. One objective criterion that defines how well an image is formed or an object is created is the edge placement error (EPE), which indicates how far an edge of an object on a wafer is shifted from its desired position on the wafer.

To remedy this problem, a mask correction technique known as optical proximity correction ("OPC") has been developed. OPC is used to compensate or correct losses in pattern-transfer fidelity in image formation, chemical and physical interactions of photoresists and developers, loading variations in etching, and interactions of pattern features in one or more steps in pattern transfer. OPC can be configured to "predistort" or "pre-compensate" pattern data of the mask to improve fidelity of the pattern as transferred to the wafer. OPC may involve adding regions to and/or subtracting regions from a mask design at locations chosen to overcome the distorting effects of diffraction and scattering. Manual OPC has been in existence for many years. Using manual OPC, an engineer may need to add regions using trial and error techniques until the desired pattern on the wafer is obtained.

While manual OPC has been effective, as the dimensions of critical features shrink, it has become apparent that the manual approach is not time/cost effective. Therefore, a systematic way is needed to enable fast processing of large, complex chips. Generally speaking, there are currently two automated approaches to OPC: (1) rule-based OPC (use geometric rules to add corrections); and (2) model-based OPC (use lithography simulations to decide corrections). Rule-based OPC is an extension of the methods used for manual OPC. Through experiment or simulation, the corrections that should be applied in a given geometrical situation may be discovered. Then, a pattern recognition system may be used to apply the corrections wherever that geometrical situation occurs throughout the entire layout design. Model-based OPC is different from rule-based OPC in that simulation models are used to predict the wafer results and modify pattern edges on the mask to improve the simulated wafer image.

OPC involves the use of a preliminary mask pattern containing multiple line widths and pitches. The preliminary pattern is based on a desired device layout and has been corrected using a model-based OPC procedure. A mask is created from the preliminary pattern and a preliminary wafer is then formed using the mask. After the preliminary wafer has been fabricated, the actual line widths and pitches on the wafer are measured. Next, the actual line widths on the wafer are compared with the ideal line widths in the desired device layout to determine the error in the actual line widths. As previously mentioned, the error between the desired or ideal line width and the actual wafer linewidth is referred to as edge placement error (EPE). Finally, the measured error is used to calibrate the model so that the model will more correctly approximate actual line widths, thereby reducing the EPE Despite calibration of the OPC model to improve its predictive abilities, inherent limitations and inaccuracies in the model itself prevent it from achieving a layout on the wafer that precisely matches the design layout. While improvements in the OPC model itself can reduce these limitations and inaccuracies, there remains a need to systematically identify and correct for the actual errors in the pattern to which the model's limitations and inaccuracies give rise.

SUMMARY OF THE INVENTION

In accordance with the present invention, a method is provided of accessing model error in an optical proximity correction (OPC) model. The method begins by obtaining a preliminary mask using an OPC model, creating an etched wafer from the preliminary mask using lithography, and measuring a specified critical dimension (CD) on the wafer and a second CD on the wafer. An edge placement error (EPE) is determined that corresponds to a difference between a measured value of the second CD on the wafer and a desired value of the second CD on the wafer. The aforementioned steps are repeated for a plurality of different values of the specified CD to obtain an EPE for each of the different values of the specified CD. For each of the plurality of values of the specified CD, a measured value of a second CD on the wafer is correlated with a corresponding value of the second CD on the mask. For each of the plurality of values of the specified CD, the measured value of the second CD on the wafer is correlated with its corresponding value of the second CD on the mask as predicted by the OPC model. For each of the immediately preceding correlations that are obtained, and at a selected measured value of the second CD on the wafer, a difference $\Delta$ is obtained between the difference of the mask CDs calculated by interpolation of wafer CD measurements and by OPC model predictions. Each value of $\Delta$ is transformed into an OPC model error that each correspond to a particular value of the specified CD.

In accordance with one aspect of the invention, a total residual error is obtained for each value of the specified CD by summing the OPC code error corresponding to each particular value of the specified CD with the OPC model error corresponding to each of the particular values of the specified CD.

In accordance with another aspect of the invention, each value of the total residual error is compared to a predetermined acceptable value of the total residual error.

In accordance with another aspect of the invention, the specified CD is pitch.

In accordance with another aspect of the invention, the second CD is line width.

In accordance with another aspect of the invention, the second CD is line width at end-of-line.

In accordance with another aspect of the invention, the second CD is spacing at end-of-line.

In accordance with another aspect of the invention, the OPC model is revised based on the OPC model error.

DETAILED DESCRIPTION

Figure 1:
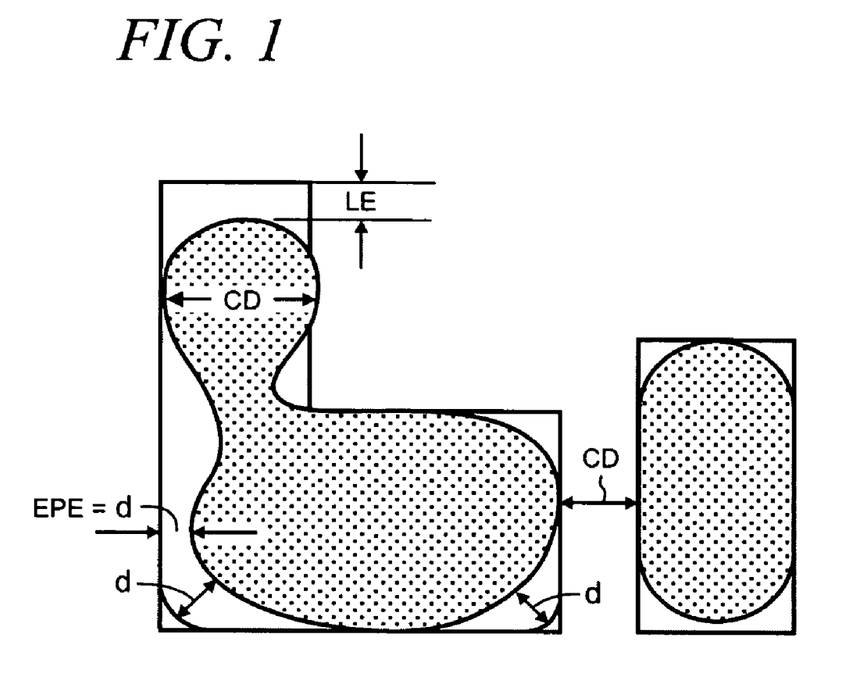
FIG. 1 shows an ideal boundary of a desired mask pattern and a boundary (shaded region) of a preliminary mask pattern that has been corrected using a model-based OPC procedure.
Figure 2:
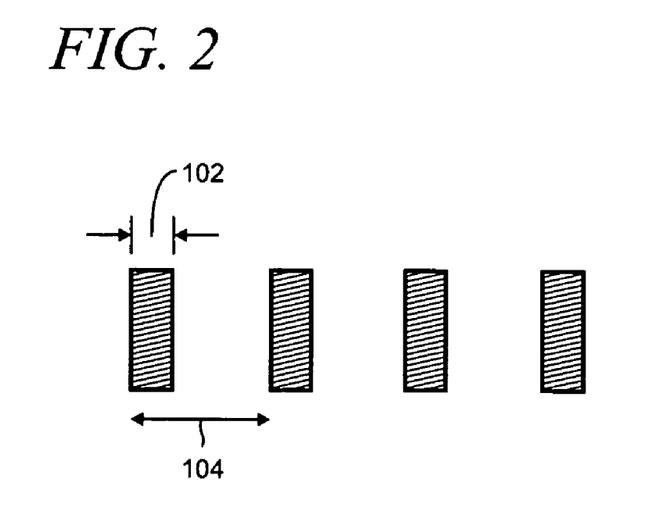
FIG. 2 shows the definition of line width and pitch.

FIG. 1 shows an ideal boundary of a desired mask pattern and a boundary (shaded region) of a preliminary mask pattern that has been corrected using a model-based OPC procedure. Two-dimensional quality parameters used herein include critical dimension (CD) errors, end of line errors (LE), and edge placement errors (EPE). Similarly, FIG. 2 shows the definition of line width and pitch, each of which may be a CD. Line width 102 is the width of a line, while pitch 104 is the pitch of the lines that define the boundaries of features or objects. Note that pitch 104 includes line width 102 and the space between lines. Optionally, pitch can be measured from midpoint of a line to the midpoint of the next line.

As the features of an integrated circuit continue to get smaller, resist effects, diffraction and process effects, and other manufacturing process variations become more significant. These diffraction effects cause the actual width of a line to change from the designed width. Moreover, the pitch of the lines also affects the diffraction and can change the actual line width from the desired width.

Figure 3:
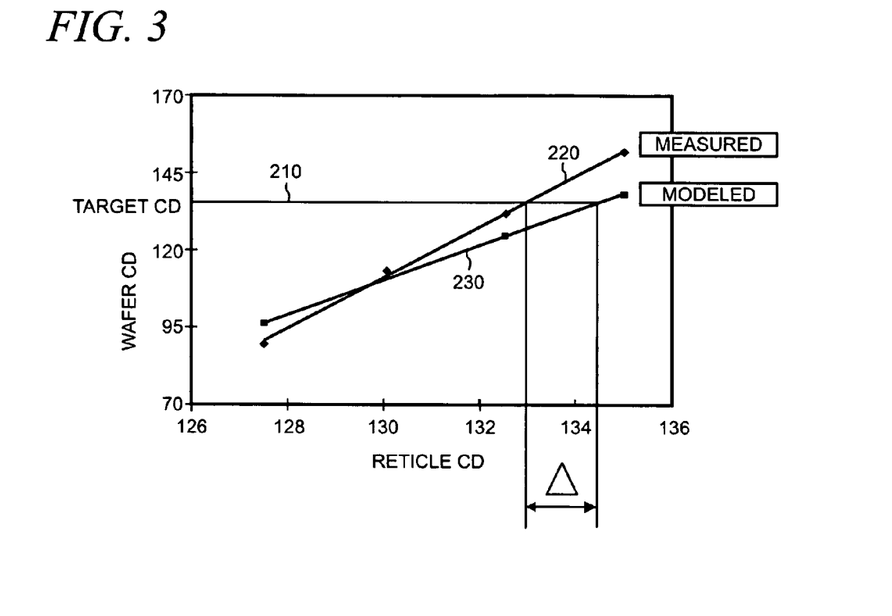
FIG. 3 is a graph plotting the actual critical dimension (CD) of a feature produced on a wafer with the corresponding CD of the feature on the mask or reticle that is used to create the wafer.

FIG. 3 is a graph plotting the actual critical dimension (CD) of a feature produced on a wafer with the corresponding CD of the feature on the mask or reticle that is used to create the wafer. For purposes of illustration only the CD that is employed is the linewidth [but could be other things like spacing, etc] The desired or target CD is also denoted on the graph by line 210. Line 220 denotes the relationship between the actual wafer CD and the actual mask CD from which the actual wafer CD is produced. Both the actual wafer CD and the actual mask CD are determined by measurement of both parameters on a series of test patterns and wafers. Line 230 denotes the relationship between the actual wafer CD and the predicted mask CD using an OPC model. As shown, there is a discrepancy between the two curves that arises from limitations in the OPC model. For the desired CD, this difference $\Delta$ corresponds to the difference in the mask CD that is needed to achieve the correct wafer CD from what the OPC model predicts.

The OPC model error can be calculated from $\Delta$. Specifically

OPC model error=$\Delta \times$MEEF,

Where MEEF is the so-called mask error enhancement factor, which is the ratio between the error on the wafer to the error on the mask. In effect the MEEF describes the amplification of the mask errors realized on the wafer.

Figure 4:
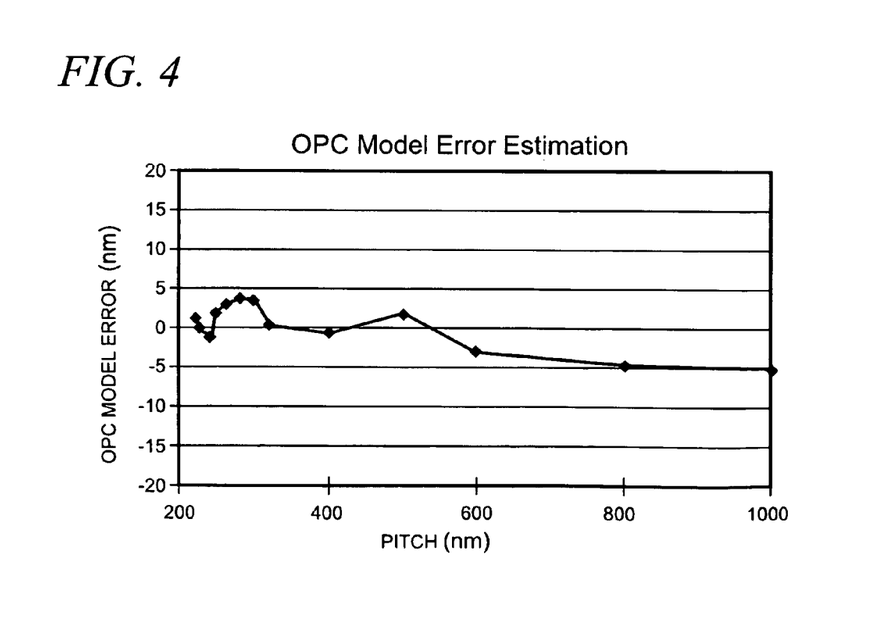
FIG. 4 is a plot showing the OPC model error as a function of pitch.

The plot in FIG. 3 is obtained for a given or fixed pitch. In accordance with the present invention, a series of such plots can be obtained for different pitches. From this series of plots, the OPC model error can be calculated as a function of pitch. FIG. 4 is a plot showing the OPC model error as a function of pitch. By quantifying the OPC model error in this manner, a correction can be added to the preliminary mask pattern. This correction is in addition to the correction that the OPC model itself provides in terms of EPE.

Figure 5:
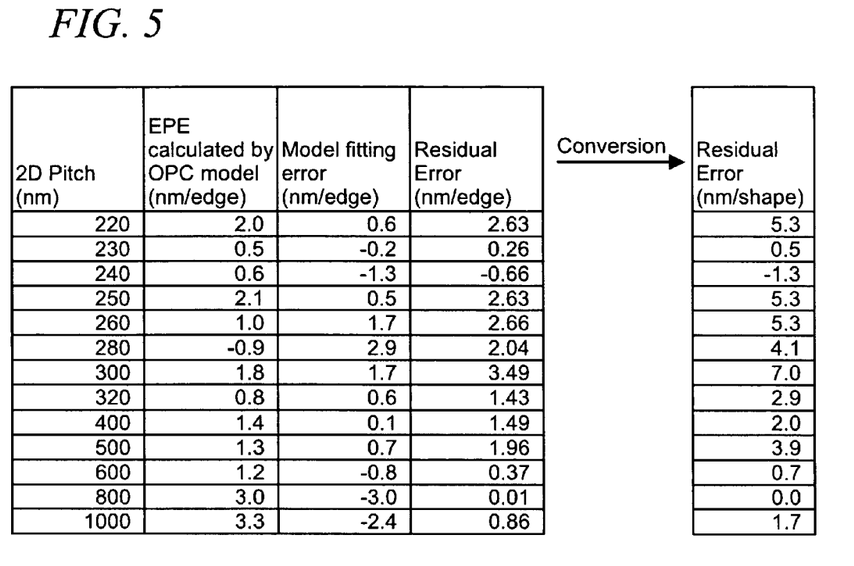
FIG. 5 is a table showing for series of different pitches the EPE calculated by the OPC model and the corresponding OPC model error as obtained from FIG. 4.

FIG. 5 is a table showing for series of different pitches the EPE calculated by the OPC model and the corresponding OPC model error as obtained from FIG. 4. The sum of these values is the total residual error in the wafer CD. That is, to most nearly obtain a desired CD on a wafer, the location of a given edge on the wafer would need to be shifted by the total residual error. Since the residual error is calculated for a single edge and not for the net error in a feature or object shape, the residual error per edge can be converted to residual error per feature shape, which is also shown in FIG. 5. This conversion can be accomplished using the following relation:

Residual error (per shape)=2×residual error (per edge)

In general, it will usually be more convenient to compare the OPC model error to the CD tolerance of a feature using the residual error per shape than the residual error per edge.

In some cases the total residual error per feature shape may be less than some specified acceptable error. In this case the location of the edge on the wafer need not be shifted by the total residual error.

The process flow performed in accordance with the present invention can be summarized by the following steps:

1. Create a preliminary mask using an OPC model;
2. Create a wafer from the preliminary mask;
3. Measure the pitch and linewidth (or some other CD) on the wafer;
4. Determine the difference between the measured linewidth and the desired linewidth, which difference divided by 2 is the EPE;
5. Repeat steps 1-4 for a series of different pitches to obtain an EPE for each of the pitches;
6. For each different pitch, plot the designed linewidth of the mask vs. the measured wafer linewidth (this corresponds to the measured line on FIG. 3);
7. For each different pitch, plot designed linewidth of the mask vs. the line width predicted by the OPC model (this corresponds to the modeled line on FIG. 3);
8. For each different pitch, and at a single desired linewidth that is the same for each pitch, determine a mask CD difference based on the wafer CD measurement and the OPC model prediction, both of which should yield the target CD.
9. Calculate the OPC model error by multiplying the mask CD difference by the MEEF which is the slope of the "modeled" line shown for each pitch. (this corresponds to FIG. 4);
10. Determining a total residual error for each of the pitches by summing the OPC code error (expressed in terms of EPE) for that pitch with the OPC model error for that pitch (this corresponds to FIG. 5).

Once the total residual error has been obtained, it can be compared to acceptable residual error tolerances. If the total residual error is less than the acceptable residual error tolerance, the OPC model is satisfactory. If the total residual error is greater than the acceptable residual error tolerance, the OPC model or OPC code may need to be modified in order to reduce the total residual error to an acceptable level.

Figure 6:
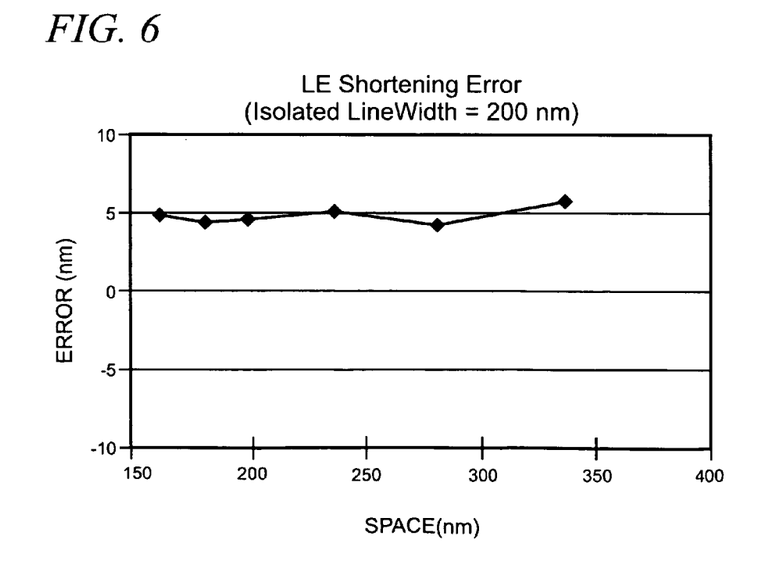
FIG. 6 is a plot showing the OPC model error as a function of spacing between lines.
Figure 7:
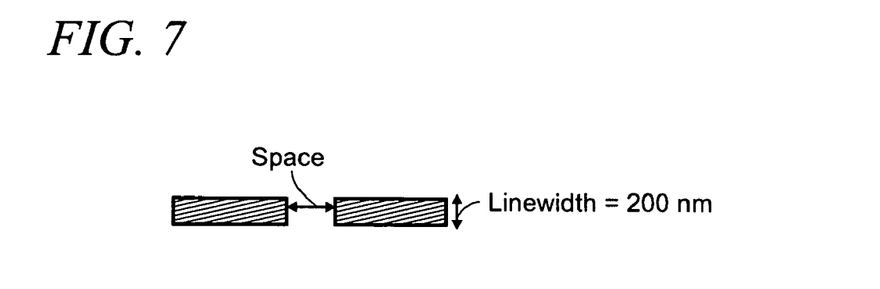
FIG. 7 shows the definition of the spacing between end of lines used in connection with end-of-line errors.
Figure 8:
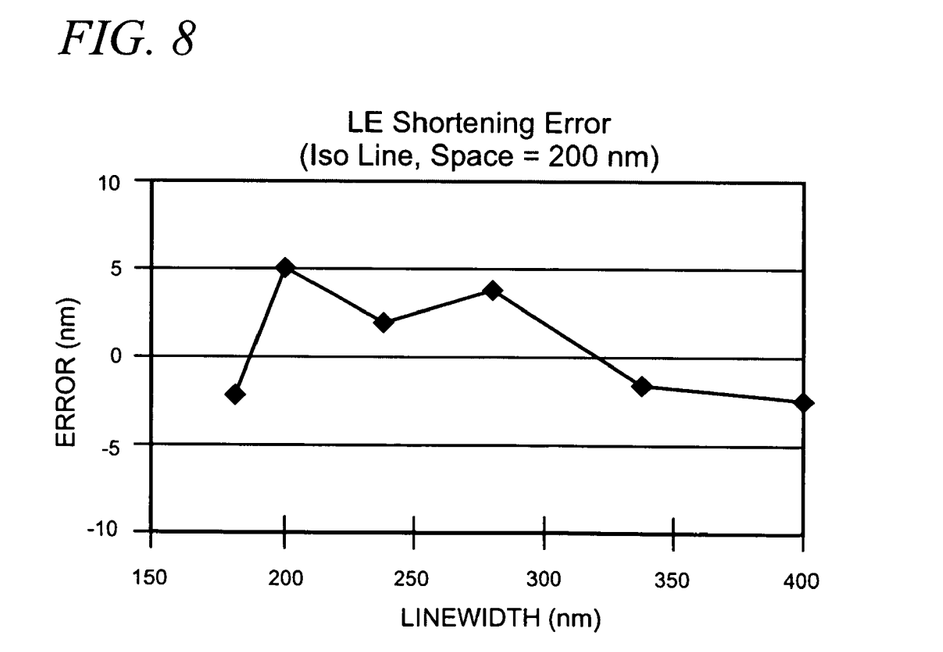
FIG. 8 is a plot showing the OPC model error as a function of linewidth.

Instead of obtaining a plot or correlation between OPC model error and pitch as in FIG. 4, it may be desirable to obtain a plot or correlation between the OPC model error and any of a variety of CDs, depending on the particular pattern that is being analyzed. For example, FIG. 6 shows a correlation between OPC error and the space between two line ends (see FIG. 7), which is obtained in a manner similar to FIG. 4. Likewise, FIG. 8 shows a plot or correlation between OPC model error and linewidth. Once again, in both cases, EPE may be used as a suitable measure of the error.

Figure 9:
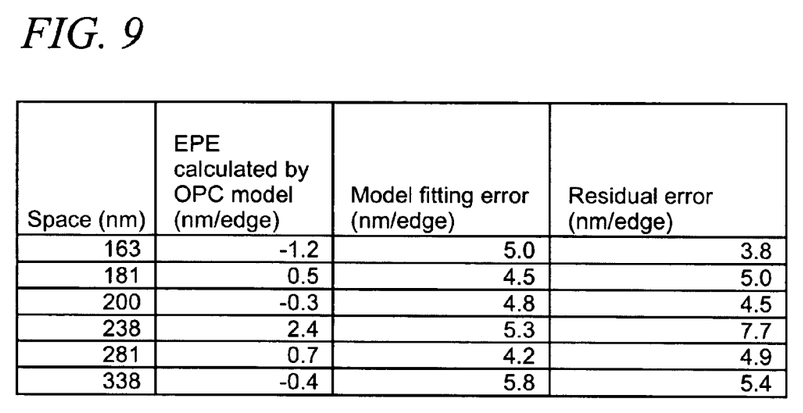
FIG. 9 is a table showing for series of different pitches the EPE calculated by the OPC model and the corresponding OPC model error as obtained from FIG. 6.
Figure 10:
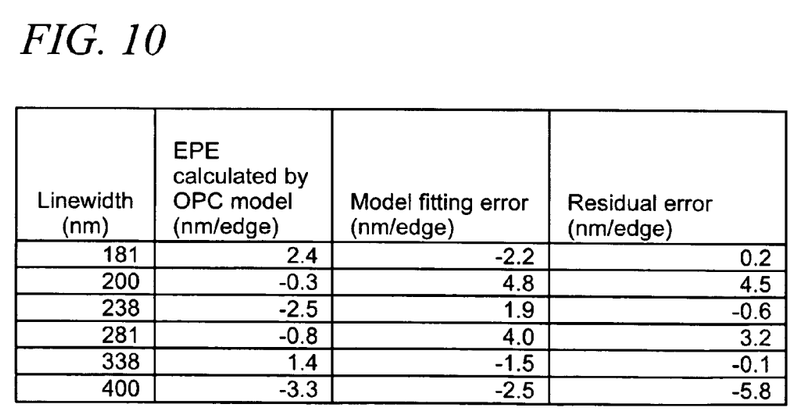
FIG. 10 is a table showing for series of different pitches the EPE calculated by the OPC model and the corresponding OPC model error as obtained from FIG. 8.

Similar to FIG. 5, FIG. 9 is a table showing for a series of different spaces between end-of-lines the EPE calculated by the OPC model and the corresponding OPC model error as obtained from FIG. 6. Likewise, FIG. 10 is a table showing for a series of different line end widths the EPE calculated by the OPC model and the corresponding OPC model error as obtained from FIG. 8.

The invention claimed is:

1. A method of accessing model error in an optical proximity correction (OPC) model, comprising:
   a. obtaining a preliminary mask using an OPC model;
   b. creating an etched wafer from the preliminary mask using lithography;
   c. measuring a first Critical Dimension (CD) on the wafer and a second CD on the wafer;
   d. determining a first edge placement error (EPE) that corresponds to a difference between a measured value of the second CD on the wafer and a desired value of the second CD on the wafer;
   e. repeating steps a-d for a plurality of different values of the first CD to obtain an EPE for each of the different values of the first CD;
   f. for each of the plurality of values of the first CD, correlating a measured value of the second CD on the wafer with a corresponding value of the second CD on the mask;
   g. for each of the plurality of values of the first CD, correlating the measured value of the second CD on the wafer with its corresponding value of the second CD on the mask as predicted by the OPC model;
   h. for each correlation obtained in step (g) and at a selected measured value of the second CD on the wafer, obtaining a difference ΔCD between the measured second CD on the mask and the corresponding value of the second CD on the mask as predicted by the OPC model;
   i. transforming each value of ΔCD into an OPC model error that each correspond to a particular value of the first CD;
   j. obtaining a total residual error for each value of the first CD by summing the EPE corresponding to each particular value of the first CD with the OPC model error corresponding to each of the particular values of the first CD;
   k. comparing each value of the total residual error to a predetermined acceptable value of the total residual error; and
   l. revising the OPC model based on the OPC model error when the value of the total residual error is greater than the predetermined acceptable value of the total residual error.

2. The method of claim 1 wherein the first CD is pitch.
3. The method of claim 1 wherein the second CD is line width.
4. The method of claim 1 wherein the second CD is line width at end-of-line.
5. The method of claim 1 wherein the second CD is spacing at end-of-line.

* * * * *

UNITED STATES PATENT AND TRADEMARK OFFICE
CERTIFICATE OF CORRECTION

PATENT NO. : 7,325,225 B2  
APPLICATION NO. : 11/243933  
DATED : January 29, 2008  
INVENTOR(S) : Tanaka Yasushi et al.

Page 1 of 1

It is certified that error appears in the above-identified patent and that said Letters Patent is hereby corrected as shown below:

On the Title Page,  
Item (57) Abstract Line 6, after "wafer", delete -- and --.

Item (57) Abstract Line 10, after "and", delete -- of --.

Item (57) Abstract Line 10, after "values" (second occurrence), delete -- of --.

Specification, Col. 1, Line 21, after "and" delete -- , --.

Specification, Col. 2, Line 29, after "EPE", insert -- . --.

Specification, Col. 4, Line 11, after "only" insert -- , --.

Specification, Col. 4, Line 13, after "etc]" insert -- . --.

Specification, Col. 5, Line 49, after "lines" insert -- , --.

Specification, Col. 5, Line 52, after "widths" insert -- , --.

Signed and Sealed this

Twenty-seventh Day of May, 2008

JON W. DUDAS  
*Director of the United States Patent and Trademark Office*